(12) United States Patent
Wu et al.

(10) Patent No.: US 9,420,723 B2
(45) Date of Patent: Aug. 16, 2016

(54) HEAT-DISSIPATION STRUCTURE FOR MOTOR CONTROLLER

(71) Applicant: Zhongshan Broad-Ocean Motor Manufacturing Co., Ltd., Zhongshan (CN)

(72) Inventors: Yonghua Wu, Zhongshan (CN); Yong Zhao, Zhongshan (CN)

(73) Assignee: Zhongshan Broad-Ocean Motor Manufacturing Co., Ltd., Zhongshan (CN)

( * ) Notice: Subject to any disclaimer, the term of this patent is extended or adjusted under 35 U.S.C. 154(b) by 352 days.

(21) Appl. No.: 13/845,084

(22) Filed: Mar. 18, 2013

(65) Prior Publication Data
US 2013/0215575 A1  Aug. 22, 2013

Related U.S. Application Data

(63) Continuation-in-part of application No. PCT/CN2012/074768, filed on Apr. 26, 2012.

(30) Foreign Application Priority Data

Aug. 30, 2011 (CN) ........................ 2011 2 0320504 U

(51) Int. Cl.
*H05K 7/20* (2006.01)

(52) U.S. Cl.
CPC ............ *H05K 7/20409* (2013.01); *H02K 11/33* (2016.01)

(58) Field of Classification Search
CPC .............. H05K 7/20409; H05K 7/209; H05K 7/20418; H05K 7/20436; H05K 7/20445; H02M 7/003; H02M 1/126; H02K 11/024; H02K 11/0073; H02K 11/33
USPC .................... 361/679.54, 704, 707, 709–711, 361/715–719; 257/712; 165/80.3, 185
See application file for complete search history.

(56) References Cited

U.S. PATENT DOCUMENTS

| | | | | |
|---|---|---|---|---|
| 6,291,878 B1* | 9/2001 | Anderson | ............. | H01L 23/051 257/691 |
| 6,704,201 B2* | 3/2004 | Kasuga | .................... | H01L 25/11 165/185 |
| 7,450,388 B2* | 11/2008 | Beihoff | .................... | B60L 11/12 361/679.48 |
| 7,733,651 B2* | 6/2010 | Hogg | ..................... | H02K 11/33 165/185 |
| 7,735,939 B2* | 6/2010 | Parshad | ................. | A47B 46/00 312/108 |
| 7,957,143 B2* | 6/2011 | Isomoto | ............. | H05K 7/20918 165/104.21 |
| 8,279,620 B2* | 10/2012 | Herron | .................. | H02M 7/003 361/784 |
| 8,299,666 B2* | 10/2012 | Shirakata | ............. | H02K 11/048 310/64 |
| 8,680,407 B1* | 3/2014 | Chan | ...................... | H02G 3/086 174/50 |
| 8,957,557 B2* | 2/2015 | Yamasaki | ............ | B62D 5/0406 310/68 D |
| 2009/0273915 A1* | 11/2009 | Dean, Jr. | ................. | H04Q 1/062 361/826 |
| 2010/0027196 A1* | 2/2010 | Schell | ...................... | H02B 1/21 361/611 |
| 2011/0163705 A1* | 7/2011 | Sato | ................... | H02K 11/0073 318/400.24 |

(Continued)

*Primary Examiner* — Anthony Haughton
*Assistant Examiner* — Matt Dhillon
(74) *Attorney, Agent, or Firm* — Matthias Scholl, PC; Matthias Scholl

(57) ABSTRACT

A heat-dissipation structure for a motor controller. The heat-dissipation structure includes a control box, a circuit board, a plurality of radiators, and IGBT modules. The circuit board is installed in the control box. Each radiator includes a side plate and a heat dissipation block protruding from the side plate. The side plate is attached to an inner wall surface of the control box. The IGBT modules are installed on the heat dissipation block, and the pin terminals protruding from the IGBT modules are in electric or electronic connection with the circuit board.

10 Claims, 6 Drawing Sheets

(56) References Cited

U.S. PATENT DOCUMENTS

| | | | |
|---|---|---|---|
| 2012/0098366 A1* | 4/2012 | Yamasaki | B62D 5/0406 310/72 |
| 2012/0104886 A1* | 5/2012 | Yamasaki | B62D 5/0406 310/71 |
| 2012/0170175 A1* | 7/2012 | Silberbauer | H05K 7/1432 361/637 |
| 2013/0049495 A1* | 2/2013 | Matsuo | H02K 5/20 310/53 |
| 2013/0257194 A1* | 10/2013 | Yamasaki | B62D 5/0406 310/52 |

* cited by examiner

HEAT-DISSIPATION STRUCTURE FOR MOTOR CONTROLLER

CROSS-REFERENCE TO RELATED APPLICATIONS

This application is a continuation-in-part of International Patent Application No. PCT/CN2012/074768 with an international filing date of Apr. 26, 2012, designating the United States, now pending, and further claims priority benefits to Chinese Patent Application No. 201120320504.3 filed Aug. 30, 2011. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 14781 Memorial Drive, Suite 1319, Houston, Tex. 77079.

BACKGROUND OF THE INVENTION

1. Field of the Invention

The invention relates to an IGBT (Insulated Gate Bipolar Transistor) heat-dissipation structure for a motor controller.

2. Description of the Related Art

The Heat-dissipation structure for a traditional motor controller includes a control box, a circuit board, a radiator, and a plurality of IGBT modules. The radiator is installed on the control box. The motor controller has the following disadvantages that firstly, the radiator is not easy to install due to the limitation of axial length and volume of the control box; secondly, the radiator is larger in volume, and only suitable for a few motor structures, thus the versatility is poor; thirdly, the IGBT modules are installed on the radiator, and the structure is tight, thus the heat dissipation effect is poor.

SUMMARY OF THE INVENTION

In view of the above-described problems, it is one objective of the invention to provide a heat-dissipation structure for a motor controller. The Heat-dissipation structure has the advantages of simple structure, convenient installation, reasonable layout and good heat dissipation effect.

To achieve the above objective, in accordance with one embodiment of the invention, there is provided a heat-dissipation structure for a motor controller, comprising a control box, a circuit board, a plurality of radiators, and IGBT modules. The circuit board is installed in the control box. Each radiator comprises a side plate and a heat dissipation block protruding from the side plate. The side plate is attached to an inner wall surface of the control box. The IGBT modules are installed on the heat dissipation block, and pin terminals protruding from the IGBT modules are in electric connection with the circuit board.

In a class of this embodiment, baffle plates extend out from edges at tail ends of the heat dissipation block. The IGBT modules are arranged between the baffle plates and the side plate. Screws pass through the IGBT modules and are embedded in threaded holes formed on side surfaces of the heat dissipation block, and the IGBT modules are locked on the side surfaces of the heat dissipation block.

In a class of this embodiment, a left connecting plate and a right connecting plate extend out from two ends of the side plate, respectively. A groove is formed on the left connecting plate, and a lug boss is protruding from the right connecting plate, and embedded in the groove on the left connecting plate of an adjacent radiator.

In a class of this embodiment, mounting holes are formed on the side plate, and screws are embedded in the mounting holes after passing through an outer wall of the control box for locking the radiators on an inner wall of the control box.

In a class of this embodiment, a plurality of radiating ribs is protruding from an outer side of the side plate and an outer wall of the control box.

In a class of this embodiment, the number of the radiators is three, the number of the IGBT modules is six, each two IGBT modules constitute a group, and the IGBT modules are installed on the radiators.

In a class of this embodiment, the side plate, the heat dissipation block, the baffle plates, the left connecting plate and the right connecting plate are integrally formed.

In a class of this embodiment, the radiators are made of aluminum.

Advantages of the invention are summarized as follows:

(1) the radiator comprises a side plate and a heat dissipation block protruding from the side plate; the side plate is tightly attached to the inner wall surface of the control box; the IGBT modules are installed on the heat dissipation block, and pin terminals protruding from the IGBT modules are in electric connection with the circuit board; thus the radiator is simple in structure, convenient to install, reasonable in layout and good in heat dissipation effect;

(2) baffle plates extend out from the edges at the tail ends of the heat dissipation block; the IGBT modules are arranged between the baffle plates and the side plate, and after penetrating the IGBT modules, screws for the heat dissipation block are embedded in threaded holes formed on the side surfaces of the heat dissipation block for locking the IGBT modules on the side surfaces of the heat dissipation block, and the IGBT modules are further positioned; thus the accurate installation position of the IGBT modules is ensured;

(3) a left connecting plate and a right connecting plate extend out from two ends of each side plate respectively; grooves are formed on the left connecting plates; lug bosses are protruding from the right connecting plates and embedded in the grooves on the left connecting plates of the adjacent radiators, and the heat dissipation block are mutually buckled into a whole; thus the strength is enhanced, and the accurate installation position of the radiator is ensured; and (4) a plurality of strip-shaped radiating ribs are protruding from the outer sides of the side plate of the radiators and the outer side wall of the control box, and the heat dissipation area is increased, thus the heat dissipation effect is good.

DETAILED DESCRIPTION OF THE EMBODIMENTS

For further illustrating the invention, experiments detailing a heat-dissipation structure for a motor controller are described below. It should be noted that the following examples are intended to describe and not to limit the invention.

Figure 1:
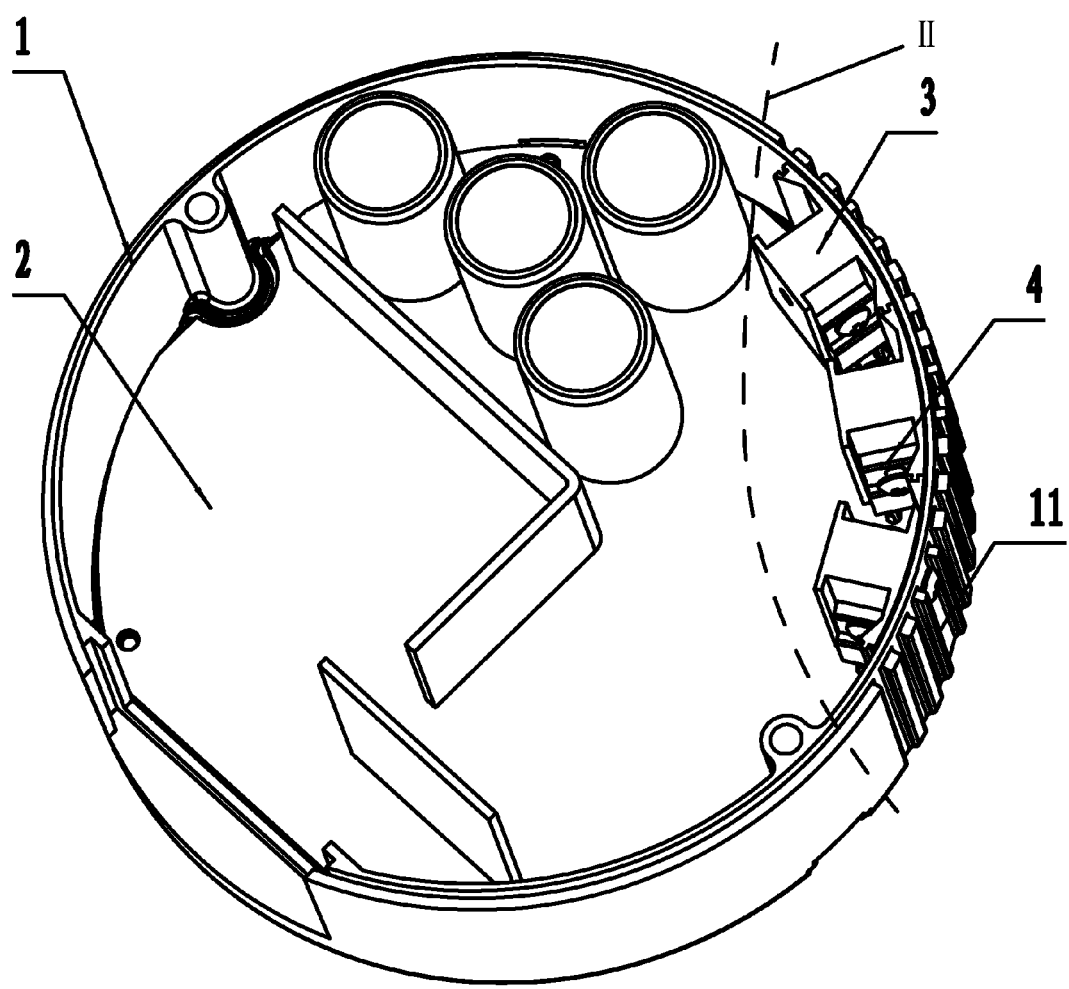
FIG. 1 is a stereogram of a heat-dissipation structure for a motor controller of the invention.
Figure 2:
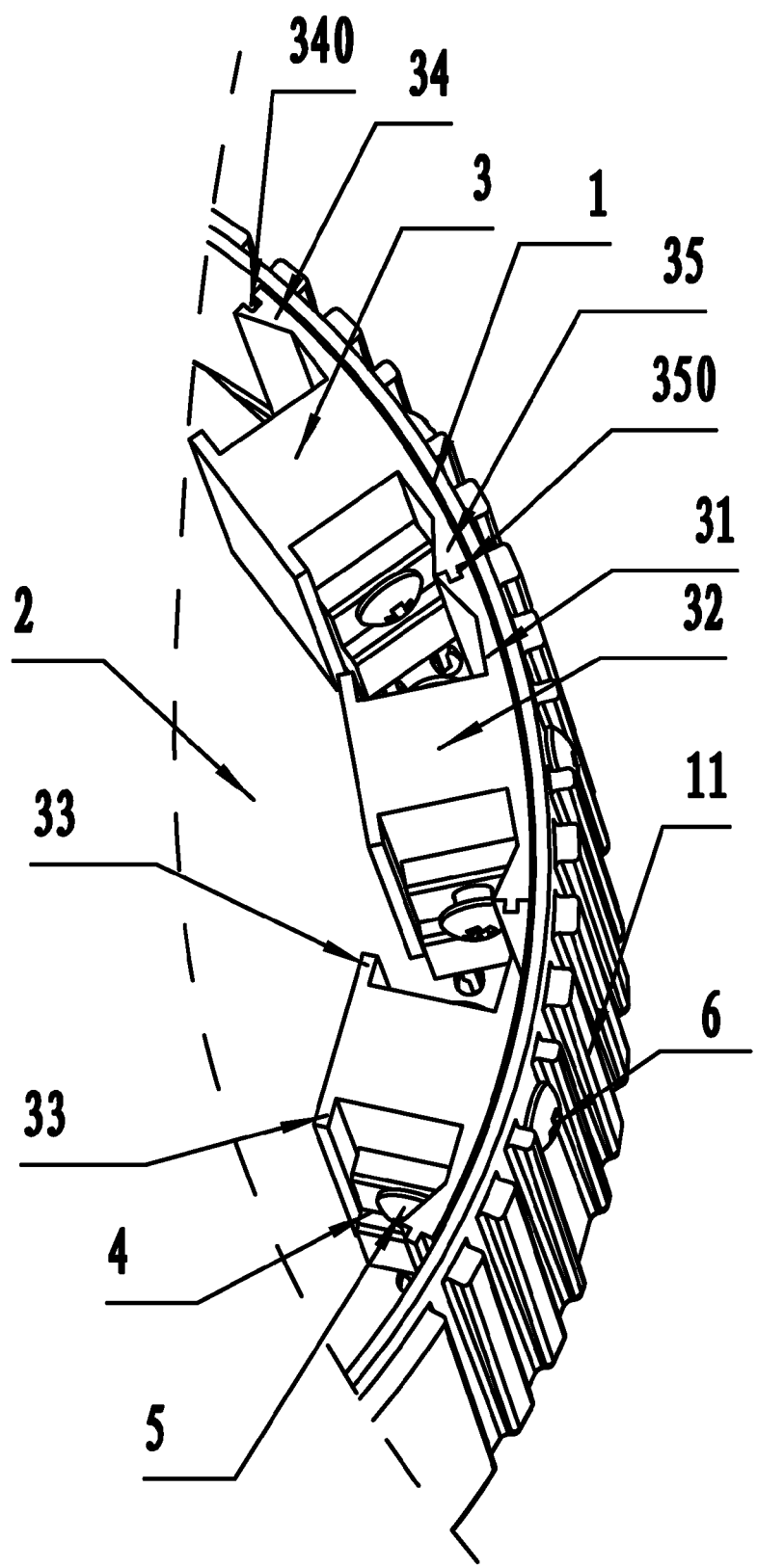
FIG. 2 is an enlarged view of part II of FIG. 1.
Figure 3:
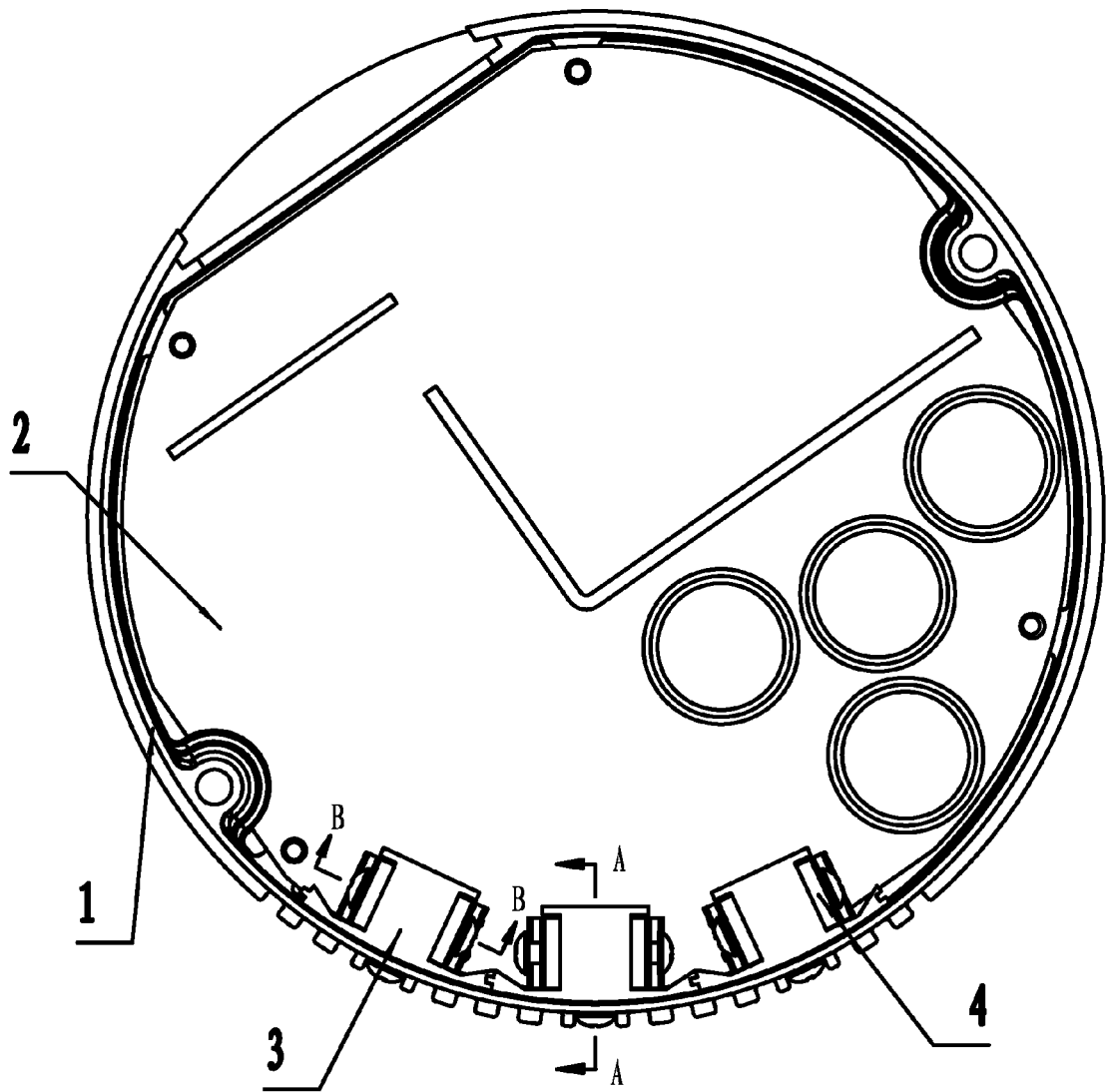
FIG. 3 is a structural diagram of a heat-dissipation structure for a motor controller of the invention.
Figure 4:
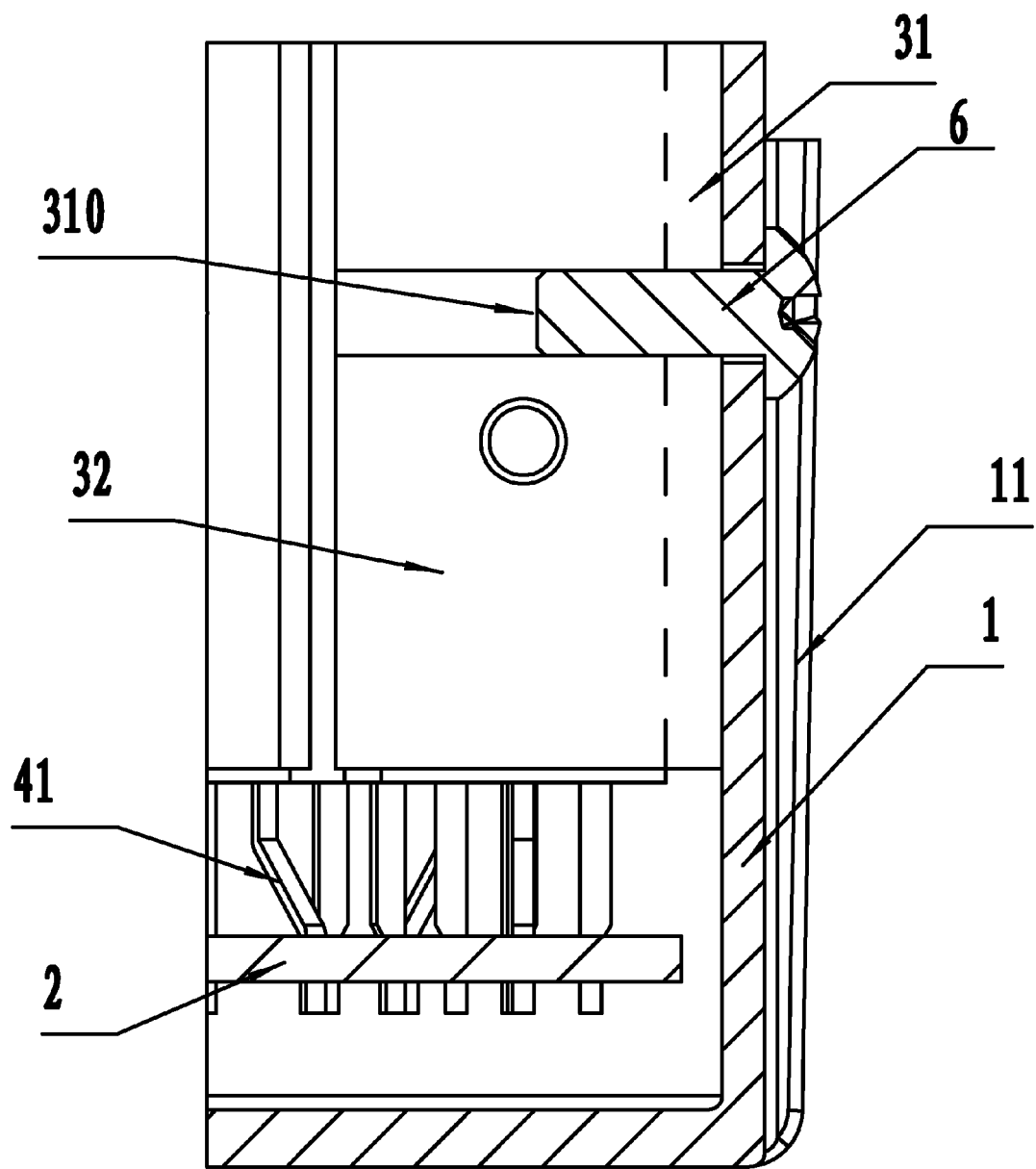
FIG. 4 is a sectional view taken from line A-A of FIG. 3.
Figure 5:
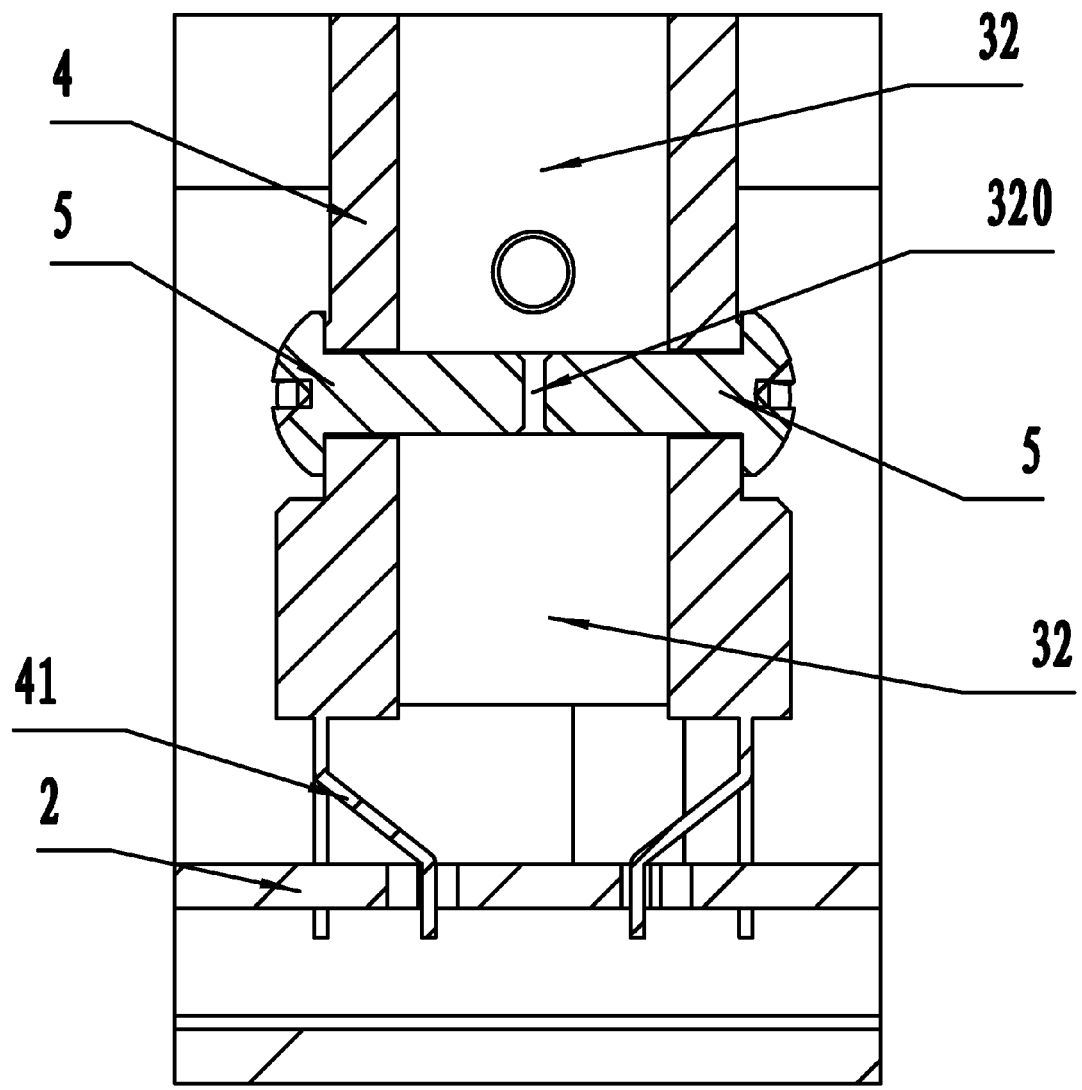
FIG. 5 is a sectional view taken from line B-B of FIG. 3.
Figure 6:
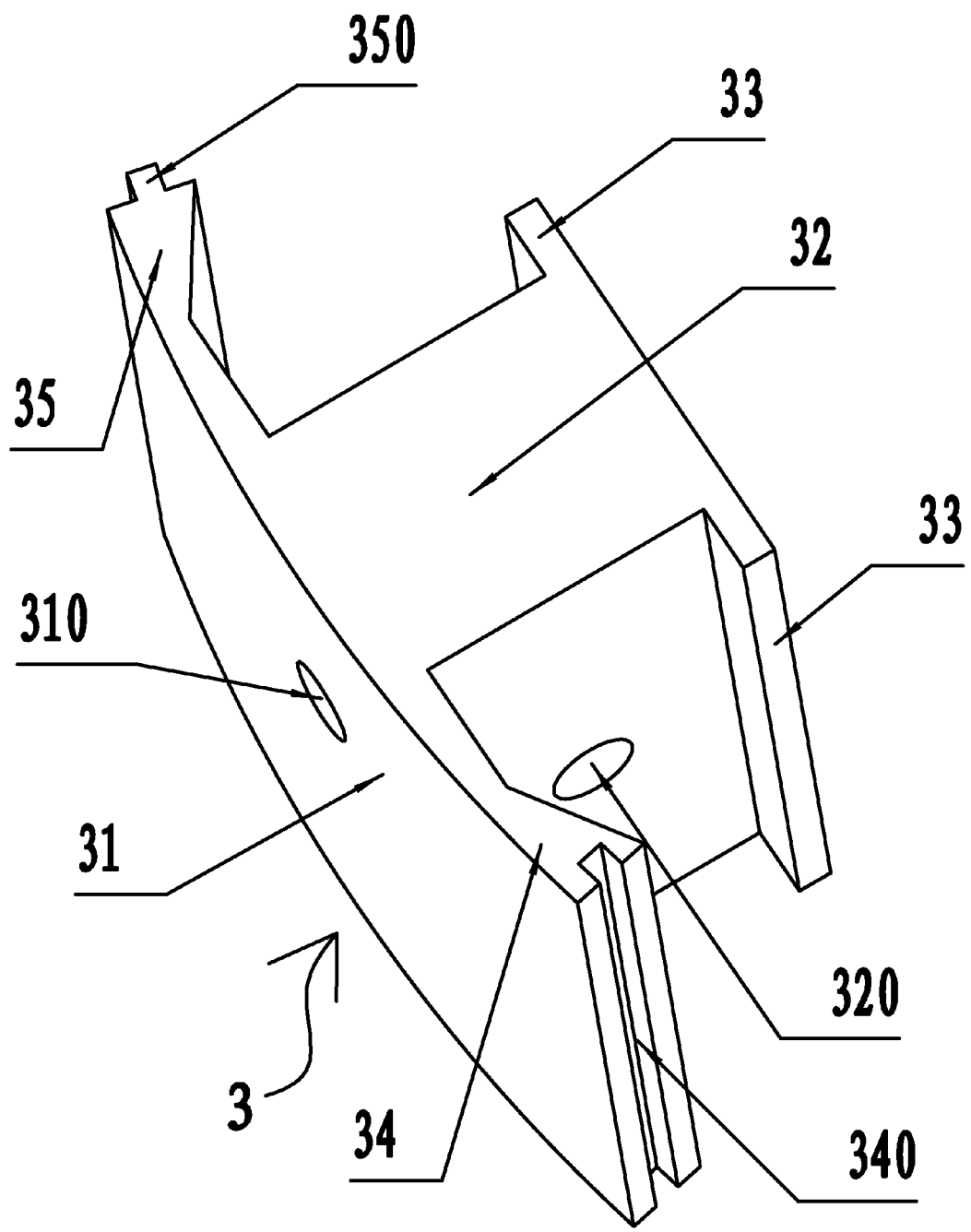
FIG. 6 is a stereogram of a radiator of a heat-dissipation structure for a motor controller of the invention.

As shown in FIGS. 1-6, a heat-dissipation structure for a motor controller comprises a control box 1, a circuit board 2, a plurality of radiators 3, and IGBT modules 4. The circuit board 2 is installed in the control box 1. Each radiator 3 comprises a side plate 31 and a heat dissipation block 32 protruding from the side plate 31. The side plate 31 is tightly attached to an inner wall surface of the control box 1. The IGBT modules 4 are installed on the heat dissipation block 32, and pin terminals 41 protruding from the IGBT modules 4 are in electric connection with the circuit board 2. Baffle plates 33 extend out from the edges at the tail ends of the heat dissipation block 32. The IGBT modules 4 are arranged between the baffle plates 33 and the side plate 31. Screws 5 pass through the IGBT modules 4 and are embedded in threaded holes 320 formed on side surfaces of the heat dissipation block 32, and the IGBT modules 4 are locked on the side surfaces of the heat dissipation block 32. A left connecting plate 34 and a right connecting plate 35 extend out from two ends of each side plate 31. A groove 340 is formed on each left connecting plate 34, and a lug boss 350 is protruding from the right connecting plates 35, and embedded in the grooves 340 on the left connecting plates 34 of an adjacent radiator 3. Mounting holes are formed on the side plate, and screws 6 for the control box are embedded in the mounting holes 310 after penetrating the side wall of the control box 1 for locking the radiators 3 on the inner wall of the control box 1. A plurality of radiating ribs 11 are protruding from the outer sides of the side plate 31 of the radiators and the outer side wall of the control box 1. The number of the radiators is three. The number of the IGBT modules is six, each two IGBT modules constitute a group, and the IGBT modules are installed on the radiators 3. The side plate 31, the heat dissipation block 32, the baffle plates 33, the left connecting plates 34 and the right connecting plates 35 are integrally formed. The radiators are made of aluminum.

Each radiator 3 comprises a side plate 31 and a heat dissipation block 32 protruding from the side plate 31. The side plate are tightly attached to the inner wall surface of the control box 1. The IGBT modules 4 are installed on the heat dissipation block 32. The pin terminals 41 protruding from the IGBT modules 4 are in electric connection with the circuit board 2. The radiator has the advantages of simple structure, convenient installation, reasonable layout and good heat dissipation effect.

The invention claimed is:

1. A heat-dissipation structure for a motor controller, the heat-dissipation structure comprising:
   a) a control box;
   b) a circuit board;
   c) a plurality of radiators; and
   d) IGBT modules;

wherein:
   the circuit board is installed in the control box;
   each radiator comprises a side plate and a heat dissipation block protruding from the side plate;
   the side plate is attached to an inner side wall of the control box;
   a plurality of baffle plates extends out from edges at tail ends of the heat dissipation block;
   a left connecting plate and a right connecting plate are disposed on two ends of the side plate, respectively;
   a groove is formed on the left connecting plate;
   a lug boss protrudes from the right connecting plate;
   the lug boss on the right connecting plate of each of the plurality of radiators is embedded in the groove on the left connecting plate of an adjacent radiator, wherein the plurality of radiators is connected and fixed to one another;
   the IGBT modules are installed on the heat dissipation block; and
   pin terminals protruding from the IGBT modules are in electric connection with the circuit board.

2. The heat-dissipation structure of claim 1, wherein
   the IGBT modules are arranged between the baffle plates and the side plate;
   screws pass through the IGBT modules and are embedded in threaded holes formed on side surfaces of the heat dissipation block; and
   the IGBT modules are locked on the side surfaces of the heat dissipation block.

3. The heat-dissipation structure of claim 1, wherein mounting holes are formed on the side plate, and screws pass through an outer wall of the control box and are embedded in the mounting holes for locking the radiators on an inner wall of the control box.

4. The heat-dissipation structure of claim 2, wherein mounting holes are formed on the side plate, and screws pass through an outer wall of the control box and are embedded in the mounting holes for locking the radiators on an inner wall of the control box.

5. The heat-dissipation structure of claim 1, wherein a plurality of radiating ribs is protruding from an outer side of the side plate and an outer wall of the control box.

6. The heat-dissipation structure of claim 1, wherein the number of the radiators is three, the number of the IGBT modules is six, each two IGBT modules constitute a group, and the IGBT modules are installed on the radiators.

7. The heat-dissipation structure of claim 1, wherein the side plate, the heat dissipation block, the baffle plates, the left connecting plate and the right connecting plate are integrally formed.

8. The heat-dissipation structure of claim 2, wherein the side plate, the heat dissipation block, the baffle plates, the left connecting plate and the right connecting plate are integrally formed.

9. The heat-dissipation structure of claim 7, wherein the radiators are made of aluminum.

10. The heat-dissipation structure of claim 8, wherein the radiators are made of aluminum.

* * * * *